(12) United States Patent
Aparin et al.

(10) Patent No.: US 7,164,325 B2
(45) Date of Patent: Jan. 16, 2007

(54) TEMPERATURE STABILIZED VOLTAGE CONTROLLED OSCILLATOR

(75) Inventors: Vladimir Aparin, San Diego, CA (US); Yue Wu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 31 days.

(21) Appl. No.: 11/066,990

(22) Filed: Feb. 25, 2005

(65) Prior Publication Data

US 2005/0231297 A1 Oct. 20, 2005

Related U.S. Application Data

(60) Provisional application No. 60/557,984, filed on Mar. 30, 2004.

(51) Int. Cl.
*H03L 1/00* (2006.01)

(52) U.S. Cl. .............. 331/176; 331/177 V; 331/36 C; 331/16

(58) Field of Classification Search .......... 331/117 FE, 331/177 V, 167, 176, 36 C, 16
See application file for complete search history.

(56) References Cited

U.S. PATENT DOCUMENTS

| 4,833,426 | A  |   | 5/1989  | Robichon et al. ........... 331/158 |
| 4,978,930 | A  | * | 12/1990 | Suter ........................... 331/176 |
| 6,426,680 | B1 |   | 7/2002  | Duncan et al. ............... 331/34 |
| 7,005,936 | B1 | * | 2/2006  | Tanzawa ..................... 331/176 |
| 2003/0076139 | A1 |   | 4/2003 | Miyagawa et al. ......... 327/156 |
| 2004/0041639 | A1 |   | 3/2004 | Fujita ........................... 331/16 |

FOREIGN PATENT DOCUMENTS

WO 02097964 12/2002

* cited by examiner

*Primary Examiner*—Arnold Kinkead
(74) *Attorney, Agent, or Firm*—Philip Wadsworth; Charles D. Brown; Howard H. Seo

(57) ABSTRACT

A Voltage Controlled Oscillator (VCO) in a battery-powered device, such as a cellular phone, can be configured to tune across a fairly wide frequency range using a relatively narrow control voltage range. The frequency response of the VCO can be temperature compensated by applying a temperature variable voltage source to varactors that form part of a VCO resonant circuit. The reference end of the varactor can be supplied with a temperature dependent voltage source that has a temperature dependence that substantially compensates for varactor temperature dependence. The temperature dependent voltage source can be a Proportional To Absolute Temperature (PTAT) device.

8 Claims, 7 Drawing Sheets

TEMPERATURE STABILIZED VOLTAGE CONTROLLED OSCILLATOR

The present Application for Patent claims priority to Provisional Application No. 60/557,984 entitled "Temperature Compensation of Oscillation Frequency" filed Mar. 30, 2004, and assigned to the assignee hereof and hereby expressly incorporated by reference herein.

BACKGROUND OF THE DISCLOSURE

Wireless communication devices are typically configured to operate in an assigned frequency band within an allocated spectrum of available frequency bands. The allocated spectrum can be a contiguous frequency span or may consist of multiple disjoint frequency spans. In some systems, the frequency assignment can be dynamic and can change during the course of communications, such as in the case of a handoff in a multi-mode cellular communication system.

Wireless communication devices typically incorporate a Voltage Controlled Oscillator (VCO) that can be tuned across a tuning range that enables the device to operate in any assigned frequency band from the multiple frequency bands. The VCO is typically incorporated into a frequency synthesizer that can include a phase locked loop (PLL) that is configured to maintain a control voltage of the VCO at a value that tunes the VCO output frequency to a desired frequency.

Because the frequency response of the VCO typically varies over an operating temperature range of the VCO, the PLL typically provides different control voltage values over temperature to achieve the same desired VCO frequency. The change in a free running VCO output frequency for a given control voltage value can be referred to as a temperature drift, and may be characterized in terms of ppm/° C. A large VCO temperature drift increases the range of control voltage that is required to maintain a given VCO output frequency over temperature.

The design of wireless communication devices is complicated by the continual desire to decrease the form factor of portable devices. For example, the size of cellular telephones has decreased from a volume the size of a small briefcase to a volume that fits easily within the palm of a hand. The shrinking form factor of wireless communication devices shrinks the volume available for portable power sources, which are typically batteries. As such, power consumption is typically of concern in wireless communication devices, and devices are designed to minimize power consumption, thereby maximizing battery life.

One way in which battery power can be decreased is by designing internal components that operate at lower voltage levels. It is not uncommon for the integrated circuits within a cellular telephone to operate at 2.2 volts or less.

The design constraints of decreased size and decreased operating voltage in conjunction with decreased power consumption create further issues for a VCO in a wireless communication device. The size of a VCO can be minimized by implementing a VCO within an integrated circuit. VCO designs have utilized external components, such as the reactive components used in the resonant circuit of the VCO, that can be relatively large compared to the rest of the VCO.

However, unless a step up voltage converter is used, the control voltage for tuning the VCO output frequency is limited to less than the supply voltage. However, the use of a step up voltage converter is typically not desirable as additional space is required. Furthermore, the converter cannot operate at 100% efficiency, resulting in additional power consumption. Thus, the control voltage available to tune the VCO output frequency is typically less than the supply voltage.

The problem of VCO frequency drift adversely affects the ability of the VCO to tune across a desired spectrum, because a portion of the control voltage tuning range is set aside to compensate for frequency drift.

BRIEF SUMMARY OF THE DISCLOSURE

A Voltage Controlled Oscillator (VCO) in a battery-powered device, such as a cellular phone, can be configured to tune across a fairly wide frequency range using a relatively narrow control voltage range. The frequency response of the VCO can be temperature compensated by applying a temperature variable voltage source to varactors that form part of a VCO resonant circuit. The reference end of the varactor can be supplied with a temperature dependent voltage source that has a temperature dependence that substantially compensates for varactor temperature dependence. The temperature dependent voltage source can be a Proportional To Absolute Temperature (PTAT) device.

The disclosure includes an integrated circuit (IC) temperature compensated VCO including a semiconductor substrate, an oscillator manufactured on the substrate and having a variable frequency resonant circuit, the frequency of the resonant circuit controlled, in part, based on a control voltage applied to at least one varactor diode, and a variable voltage source manufactured on the substrate having an output coupled to a reference end of the at least one varactor and configured to substantially compensate for a temperature sensitive frequency drift attributable to the at least one varactor.

The disclosure also includes an IC temperature compensated VCO, including a substrate, a CMOS oscillator manufactured on the substrate, an LC resonant tank manufactured on the substrate and coupled to the CMOS oscillator to control the frequency of oscillation of the CMOS oscillator, and having at least a portion of the resonant frequency determined by a control voltage applied to each cathode of a pair of varactor diodes having a common anode connection, and a temperature variable voltage source manufactured on the substrate and having an output coupled to the common anode connection.

The disclosure also includes a method of temperature compensating a VCO, including generating a temperature variable voltage source, and applying an output of the temperature variable voltage source to a reference side of at least one varactor diode in a resonant circuit of the VCO.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF THE DISCLOSURE

Figure 1:
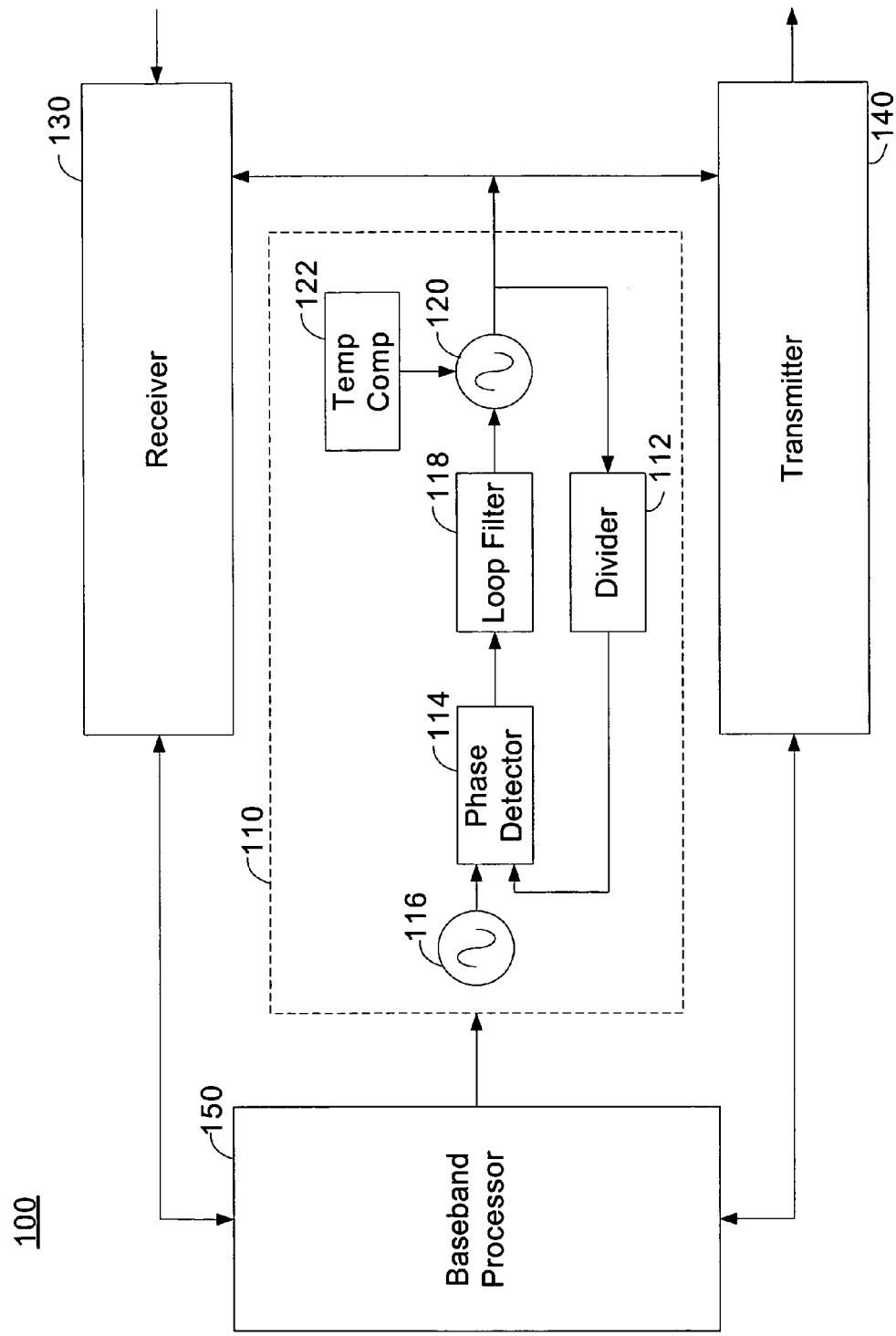
FIG. 1 is a functional block diagram of an embodiment of a VCO incorporated within a wireless communication device.

Frequency stability is an important issue in VCO design. The VCO frequency stability can be of particular concern for a wireless communication device such as a CDMA receiver, which receives signal continuously and cannot be interrupted to re-calibrate the VCO discrete frequency control. Attempts to decouple the VCO phase noise and tuning range using a plurality of discrete frequency steps would typically not alleviate problems associated with VCO frequency drift because the minimum continuous tuning range is typically determined by the maximum frequency drift of the VCO. Inside a cellular phone, the VCO frequency drift is most likely to be caused by the temperature variations that can be due to a variety of factors, including self heating or environmental temperature change. VCO frequency drift can also be affected by variations in the or battery supply.

For example, a 1.7 GHz CMOS VCO can easily drift more than 15 MHz over a temperature range spanning −30° C. to 90° C. A VCO frequency drift of this magnitude may cause the Phase Lock Loop (PLL) to lose lock if the continuous tuning range of the VCO is not high enough. Instead of increasing the continuous tuning range at the price of phase noise, the disclosed apparatus and methods minimize the frequency drift over temperature.

Apparatus and methods are disclosed for compensating for VCO frequency drift attributable to temperature variations. The described apparatus include a fully integrated CMOS VCO with very low sensitivity to temperature and supply variations, capable of meeting the stringent phase noise requirement typical for Zero-IF CDMA receiver applications. The VCO and temperature compensation module can be manufactured on the same IC semiconductor substrate, and the IC can be configured to operate at relatively low supply voltages, such as 1.1V, 2.2V, or 3.3V.

The disclosed apparatus and methods compensate for VCO frequency drift by compensating for component temperature variations. In particular, the temperature dependence of the components within the VCO resonant circuit, alternatively referred to as the VCO tank circuit, can be compensated. Where the resonant circuit includes inductive and capacitive components, the temperature compensation can be performed on the capacitive elements. For example, the resonant circuit can be a tunable circuit that includes one or more fixed value inductors and one or more tunable capacitors. The tunable capacitors can be varactor diodes, typically referred to simply as varactors. The varactors are often positioned in a back to back configuration with a common return between two varactors to facilitate voltage biasing of the elements.

A temperature variable voltage source can be applied to the backside of the varactors to compensate for the temperature sensitive frequency variations of the VCO. The temperature variable voltage source can be configured, for example, as a Proportional To Absolute Temperature (PTAT) module. The PTAT module can include a constant current source configured to drive a selectable resistive load. The resistive load can include an array of selectable composite resistors, with each composite resistor including a series connection of two resistors. One of the resistors can exhibit a negative temperature coefficient (TC) and the other resistor in the series configuration can exhibit a positive TC. Changing the percentage of the two resistors can change the TC of the overall composite resistor. The VCO frequency drift over temperature can be compensated by selecting the composite resistor with the appropriate TC.

Although the following description describes temperature compensation as performed using a PTAT source, the source need not be exactly proportional to absolute temperature, and can be substantially or generally proportional to temperature over the desired operating temperature range. Thus, the term PTAT refers to PTA as well as near PTAT, substantially PTAT, and PTAT or near PTAT over a predetermined temperature range. Additionally, depending on the temperature drift characteristics being compensated, the compensation maybe performed on the basis of a near-PTAT, Complementary To Absolute Temperature (CTAT), near-CTAT, or combination of PTAT and CTAT sources.

FIG. 1 is a functional block diagram of an embodiment of a VCO 120 incorporated within a wireless communication device 100. The wireless communication device 100 can be, for example, a portable wireless telephone such as a cellular phone operating in a cellular or personal communications service (PCS) band.

The wireless communication device 100 can include a frequency synthesizer 110 that can be selectively programmed to a frequency within one or more predetermined frequency bands. The frequency synthesizer 110 can include a the VCO 120 operating in a phase lock loop (PLL) having a programmable divider ratio.

The VCO 120 can operate at the output frequency of the frequency synthesizer 110 and can be frequency stabilized, in part, using a temperature compensation module 122 that will be described in additional detail in relation to subsequent figures. The output of the VCO 120 can be coupled to an input of a programmable divider 112 that can be configured to implement a particular divider ratio based on a range of possible divider ratios. The selection of the divider ratio, in part, determines the output frequency of the VCO 120.

The output from the programmable divider 112 can be coupled to a first input of a phase detector 114. An output from a reference oscillator 116 can be coupled to a second input of the phase detector 114.

The reference oscillator 116 is typically a highly stable single frequency oscillator. The reference oscillator 116 can be a frequency and temperature stabilized oscillator and can be, for example, a Temperature Compensated Crystal Oscillator (TCXO).

The phase detector 114 can be configured to compare the phase of the scaled VCO frequency to the phase of the reference oscillator 116 output signal and can be configured to output a control signal based on the comparison. The output of the phase detector 114 can be coupled to an input of a loop filter 118. The loop filter 118 can be used to configure the loop bandwidth of the frequency synthesizer 110, which affects the acquisition and tuning rate of the frequency synthesizer 110 and the phase noise of the VCO 120 output. The loop filter 118 can operate to smooth the transitions of the signal output from the phase detector 114. The output of the loop filter 118 can be coupled to the control input of the VCO 120 to lock the VCO 120 to the desired output frequency.

The output of the frequency synthesizer 110 can be coupled to a receiver 130 and a transmitter 140. The output from the frequency synthesizer 110 can be, for example, the local oscillator (LO) for the receiver 130.

In one embodiment, the receiver 130 can be configured to be a direct downconversion receiver, alternatively referred to as a zero Intermediate Frequency (IF) receiver. In a zero IF receiver, the LO can be tuned to be substantially the same frequency as the center frequency of the operating frequency band for those embodiments implementing double sided modulation. The receiver 130 can frequency convert an input RF signal using to the frequency synthesizer 110 output, to substantially baseband frequencies.

The output of the receiver 130 can be coupled to a baseband processor 150 for additional processing. For example, the baseband processor 150 can perform demodulation and output of the received data.

The baseband processor 150 can also be configured to interface with external input devices (not shown) to accept input signals or data. The baseband processor 150 can be configured to process the input data and signals and generate a transmit output signal that can be coupled to the transmitter 140 for upconversion and transmission. In one embodiment, the transmit signal can be a baseband signal and the transmitter can upconvert the signal to a transmit band using the output from the frequency synthesizer 110. The transmitter 140 can be configured to include an additional fixed frequency oscillator that is configured to offset the frequency from the frequency synthesizer if the transmit frequency band is not identical to the receive frequency band. In another embodiment, the transmit output from the baseband processor 150 can be an IF signal centered at a frequency offset between the transmit and receive frequency bands.

In one embodiment, substantially all of the elements of the frequency synthesizer 110 can be implemented within a single IC. In other embodiments, the single IC can also be configured to implement some or all of the features of the receiver 130 and transmitter 140. To minimize the battery power consumed, the IC can be designed to operate from a relatively low supply voltage. For example, the supply voltage may be as low as 3.3 volts, 2.2 volts, 1.1 volts or some other relatively low voltage. The IC may not implement any type of step up regulation to maintain the relatively low power consumption typically associated with low voltage devices. Additionally, the omission of a step up power converter conserves the power that would be loss in the inefficiency of a power supply.

A frequency synthesizer 110 operating in such a low voltage IC has a limited voltage range over which the VCO 120 control voltage may operate. Typically, an internally controlled voltage such as the VCO 120 control voltage is unable to traverse the entire supply voltage range. There typically exists some amount of margin that exists between the voltage supply rails and the achievable internal voltage. Thus, typically internal IC voltages, such as the VCO 120 control voltage, will be limited to a subset of the supply voltage range. For example, in a 2.2 volt IC, the VCO control voltage may be limited to a range of 0.4–2.0 volts.

The output of the phase detector 114, and thus from the lop filter 118, may have a range that is limited by the supply voltage and the ability to generate an internal voltage near the voltage rails. Thus, the output frequency range of the VCO 120 can also be constrained by the limited tuning range that can be output from the control voltage source.

If the VCO 120 frequency drift is substantial, a substantial portion of the available control voltage range may need to be reserved to allow the PLL to compensate for the frequency drift. The temperature compensation module 122 can be configured to compensate for the frequency drift of the VCO 120, thereby allowing substantially the whole control voltage range to be available for selecting the VCO 120 output frequency.

In one embodiment, the temperature compensation module 122 can operate in conjunction with the VCO 120 to correct frequency drift in an open loop manner. In another embodiment, the temperature compensation module 122 can operate in conjunction with the VCO 120 in a closed loop temperature correction process. As will be seen in subsequent figures, the temperature compensation module 122 can include multiple temperature correction components that may operate to independently compensate sources of frequency drift.

Figure 2:
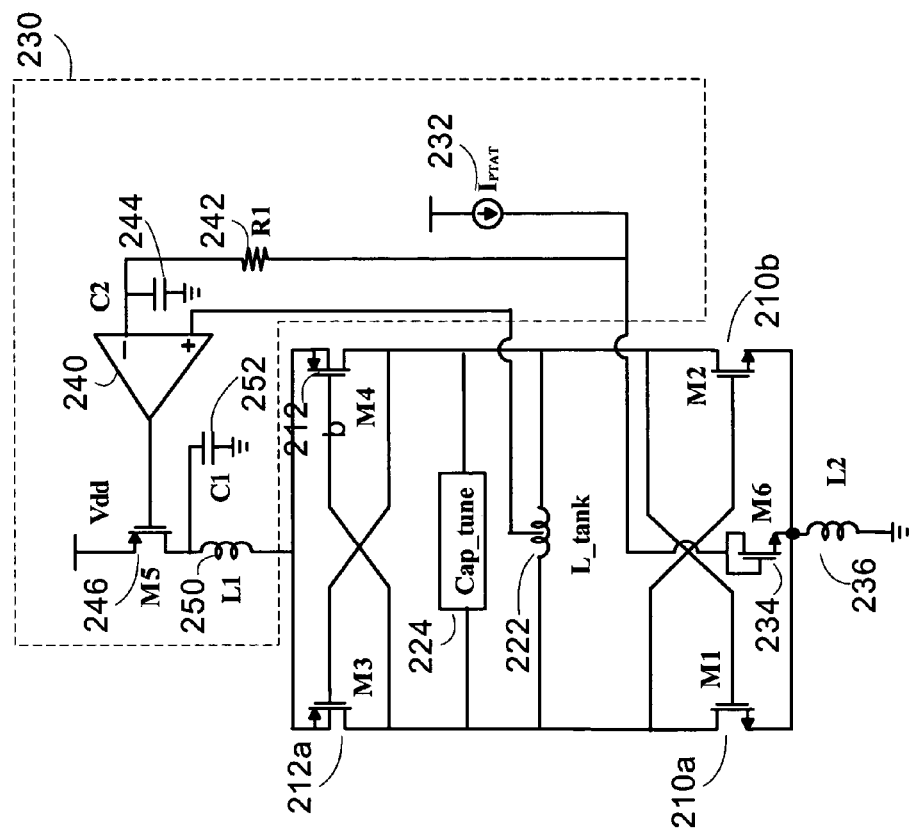
FIG. 2 is a functional block diagram of an embodiment of a temperature compensated VCO.

FIG. 2 is a functional block diagram of an embodiment of a temperature compensated VCO 120, which can be used in the wireless communication device of FIG. 1. The VCO 120 embodiment of FIG. 2 is configured as a cross-coupled CMOS VCO having a variable LC tank circuit.

The VCO 120 can be viewed as a first CMOS inverter including first PMOS and NMOS transistors 212a and 210a cross coupled to a second CMOS inverter including second PMOS and NMOS transistors 212b and 210b. A tunable LC tank circuit including a parallel combination of an inductor 222 and a tunable capacitor module 224 couples the output of each of the inverters back to its input. The tunable capacitor module 224 can be a temperature compensated capacitor module, as will be described below.

The VCO 120 can include a temperature compensated bias module 230 that includes a Proportional To Absolute Temperature (PTAT) current source 232 configured to drive an active load having a load transistor 234 in series with an RF choke 236 that couples the load transistor 234 to ground, which may also be referred to as a DC return, or voltage common. In this configuration, the PTAT current source 232 and load transistor 234 are equivalent to a PTAT voltage source. The RF choke 236 can also couple the return for the CMOS transistors to the ground.

The PTAT current source 232 can also be coupled to a low pass filter (LPF) having a series resistor 242 and shunt capacitor 244. The output of the LPF can be coupled to an input of a difference amplifier 240. The reference input of the difference amplifier 240 can be coupled to a midpoint of the tank inductor 222, which represents a virtual ground. The output of the difference amplifier 240 controls a bias transistor 246 that supplies the bias current to the inverters through an RF choke 250. The output of the bias transistor 246 may be filtered with a bypass capacitor 252.

The frequency of oscillation can be varied by varying the resonant frequency of the LC tank circuit. The inductor can be a fixed value inductor that can be manufactured on a semiconductor substrate. Typically, inductor variations over temperature are not substantial, and may be neglected.

The capacitors in a tunable LC tank can include one or more varactors that are biased to a voltage that determines their capacitance. Coupling capacitors may be used to couple the varactors to the remaining portions of the LC tank and isolate the DC bias applied to the varactors from the remainder of the VCO 120. The coupling capacitors can be, for example, Metal-Insulator-Metal (MIM) capacitors fabricated within an IC.

The VCO 120 can also include one or more selectable fixed value capacitors coupled in parallel to the varactors in the LC tank. The fixed value capacitors can be selectively coupled to the LC tank to change the VCO 120 operation to discrete frequency bands.

Additionally, the VCO 120 oscillation frequency can be affected by the junction capacitance contributed by each of the transistors in the CMOS inverters. The effective value of the tank capacitance can thus be a combination of multiple capacitor values.

Because the various capacitors contributing to the frequency of oscillation can have substantial temperature coefficients, the frequency drift of the VCO 120 can be substantially compensated by compensating for the variation in capacitance.

Figure 3:
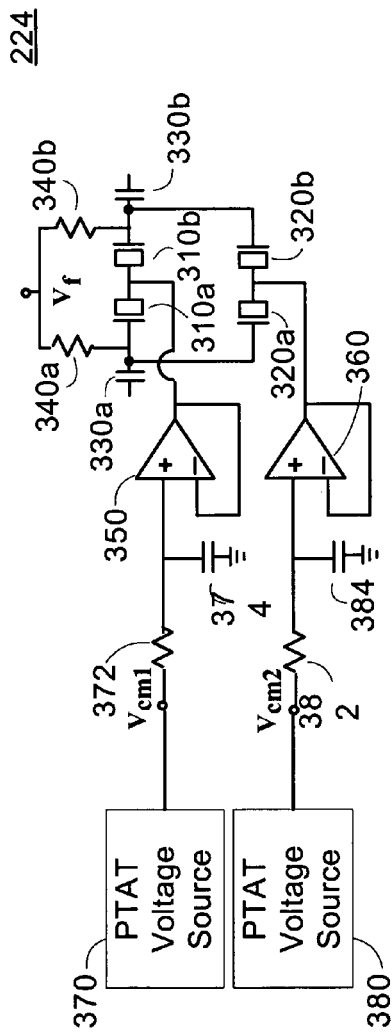
FIG. 3 is a functional block diagram of an embodiment of temperature compensated tuning capacitor module.

FIG. 3 is a functional block diagram of an embodiment of temperature compensated tuning capacitor module 224. The temperature compensated tuning capacitor module 224 can include a plurality of varactors 310a–310b and 320a–320b that are temperature compensated using PTAT voltage sources 370 and 380.

First and second varactors 310a and 310b can be arranged in a back to back configuration having common anodes. First and second bias resistors 340a and 340b couple the anodes of the first and second varactors 310a and 310b, respectively, to a frequency control voltage source (not shown) which can be, for example, the output of the loop filter in the synthesizer shown in FIG. 1. The capacitance of the first and second varactors 310a and 310b varies based on the magnitude of the reverse voltage bias. Thus, by varying the frequency control voltage, the capacitance of the tank is varied and the frequency of operation for the VCO can be varied.

First and second DC blocking capacitors 330a and 330b couple the varactors to the remainder of the LC tank and prevent the frequency control voltage from otherwise affecting the operation of the VCO. The DC blocking capacitors 330a and 330b can be manufactured as MIM capacitors, particularly when the VCO is manufactured entirely on a semiconductor substrate.

The temperature variation of the first and second varactors 310a and 310b can be compensated, at least in part, by applying a temperature varying voltage to the backside, or anode, of the varactors 310a and 310b. The temperature varying voltage can be generated by a first PTAT voltage source 370 whose output is buffered by a first buffer amplifier 350. A lowpass filter including a series first resistor 372 coupled to a first capacitor 374 in shunt couples the output of the first PTAT voltage source 370 to the input of the first buffer amplifier 350. The RC filter can provide a bandwidth that is configured to reduce noise contributions on the back sides of the first and second varactors 310a and 310b. The bandwidth of the RC filter can be, for example, on the order of a few to several kHz. The first buffer amplifier 350 is employed as a low-noise voltage follower to present low impedance at the common nodes of the varactor pair to avoid the low pole frequency of the RC filter from interfering with the PLL loop filter.

The first buffer amplifier 350 drives the common anode connection of the first and second varactors 310a and 310b. The first PTAT voltage source 370 can be configure to substantially compensate for the capacitance variation attributable to temperature. The first buffer 350 can also be configured to provide a low impedance connection from the first and second varactor 310a and 310b anodes to a reference.

In one embodiment, the first PTAT voltage source 370 can be configured to increase its output bias voltage over temperature. The increase in the bias voltage from the first 370 PTAT voltage source can allow the capacitance of the first and second varactors 310a and 310b to be decreased without changing the tuning voltage. The first and second varactors 310a and 310b can be coupled through MIM DC blocking capacitors 330a and 330b to the VCO tank so that the voltage swing across the first and second varactors 310a and 310b can be small enough to neglect the non-linear averaging effect.

If the first and second varactors 310a and 310b have a relatively steep voltage to capacitance variation, the offset capacitance required for temperature compensation can vary based on the tuning voltage. This is undesirable because the compensation would be highly dependent on the tuning voltage. To reduce the effects of tuning voltage third and fourth varactors 320a and 320b can be added in parallel to the first and second varactors 310a and 310b. The third and fourth varactors 320a and 320b can be arranged in a back to back configuration with the anodes of the third and fourth varactors 320a and 320b coupled together. The cathodes of the third and fourth varactors 320a and 320b can be common with the cathodes of the first and second varactors 310a and 310b, respectively.

The back-side of the third and fourth varactors 320a and 320b can be biased with a temperature varying voltage generated by a second PTAT voltage source 380 whose output is buffered by a second buffer amplifier 360. A lowpass filter including a series second resistor 382 coupled to a second capacitor 384 in shunt couples the output of the second PTAT voltage source 380 to the input of the second buffer amplifier 360. The bandwidth of the RC filter can be similar to that of the RC filter used with the first PTAT voltage source 370 and can be, for example, on the order of a few to several kHz. The second buffer amplifier 360 drives the common anode connection of the third and fourth varactors 320a and 320b. The second PTAT voltage source 380 can be configure to substantially compensate for the capacitance variation attributable to temperature. The second buffer 360 can also be configured to provide a low impedance connection from the third and fourth varactor 320a and 320b anodes to a reference. The second PTAT voltage source 380 may operate independent of the first PTAT voltage source 370.

The parallel combination of the first and second varactors 810a and 810b with the third and fourth varactors 820a and 820b allows the temperature compensated tuning capacitor module 224 to achieve a desired capacitance range using a smaller tuning voltage range, and can also reduce the temperature sensitivity of the combined capacitance.

In one embodiment, different bias voltages can be applied to the backsides of the two varactor pairs. A first voltage bias, generated for example by the first PTAT voltage source 370, can be applied to the backsides of the first and second varactors 310a and 310b. The first voltage bias can be, for example, a relatively small voltage. A second voltage bias, generated for example by the second PTAT voltage source 380, can be applied to the backsides of the third and fourth varactors 320a and 320b. The second voltage bias can be, for example, a relatively large voltage, resulting in a relatively small reverse bias across the third and fourth varactors 320a and 320b. The temperature coefficient from the first PTAT voltage source 370 may then be different from the temperature coefficient of the second PTAT voltage source 380, due to the differing reverse bias voltages across the respective varactor pairs. The offset capacitance can be averaged over the range from the first PTAT voltage source 370 output to the second PTAT voltage source 380 output. A relative constant compensation can be achieved over wider tuning voltage range.

Figure 4:
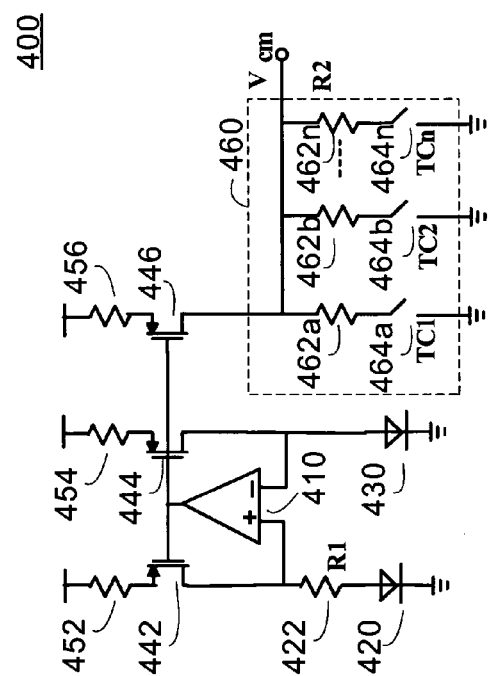
FIG. 4 is a functional block diagram of an embodiment of a temperature compensated voltage source.

FIG. 4 is a functional block diagram of an embodiment of a PTAT voltage source 400, which may be configured as either of the PTAT voltage sources shown in FIG. 3. Additionally, if the resistive load is omitted from the PTAT voltage source 400, the remaining circuit defines a PTAT current source which may be used as the PTAT current source shown in FIG. 2.

The PTAT voltage source 400 includes a differential amplifier 410 having first and second junction diodes 420 and 430 coupled to the inputs of the differential amplifier 410. A first junction diode 420 is coupled to a first resistor 422. The first resistor 422 is coupled to the non-inverting input of the differential amplifier 410. A second junction diode 430 is coupled to the inverting input of the differential amplifier 410. The first and second junction diodes 420 and 430 can be, for example, bipolar diodes, base-emitter junctions from bipolar transistors, base emitter junctions from parasitic bipolar transistors produced in a CMOS circuit, MOS transistors operated in inversion, and the like, or some other junction diode.

The output of the differential amplifier 410 controls a current mirror. The output of the differential amplifier 410 can be configured to drive the gates of first and second FETs 442 and 444 that have their drains pulled up to a supply voltage using first and second pull up resistors 452 and 454. The source of the first FET 442 is coupled to the non-inverting input of the difference amplifier 410, and the source of the second FET 444 is coupled to the inverting input of the differential amplifier 410.

A PTAT current can be generated by the combination of differential amplifier 410 and current mirror by varying the areas of the first and second diodes 420 and 430. The difference in diode areas creates a forward voltage variation that is substantially proportional to temperature. The difference amplifier 410 is configured to amplify the difference between the diodes and control a current mirror based on the difference.

A third FET 446 has its drain pulled up to the voltage reference by a third resistor 456. The gate of the third FET 446 is controlled by the output of the differential amplifier 410 to produce a PTAT current source. The output of the PTAT current source can be coupled to a resistive load 460 to produce a PTAT voltage output.

The resistive load 460 can include an array of resistors that can be configured as a parallel combination of a plurality of composite resistors 462a–462n. Each of the composite resistors 462a–462n can be selectively included or omitted from the resistive load 460 using a corresponding switch 464a–464n coupled in series with the resistor. The switches 464a–464n can be, for example, transistors, mechanical switches, including MEMs switches, fuses, and the like, or some other controllable connection, or combination of controllable connections. Note that a fuse can be used as a controllable connection for the configuration where the selection of a resistor for the resistive load 460 can be performed on a one time basis.

Each of the composite resistors 462a–462n can include at least one resistor. For those composite resistors having greater than one resistor, the composite resistor can include a series connection of two or more resistors having positive and negative temperature coefficients (TC). The overall TC of the composite resistor can be adjusted by varying percentage of the resistors having one of the TCs.

The overall TC of the PTAT voltage source 400 can be modified based on the selection of the composite resistors 462a–462n in the resistive load 460. Thus, the TC of the resistive load 460 can be used to supplement, negate, or otherwise modify, some or all of the TC of the PTAT current source.

Figures 5A, 5B:
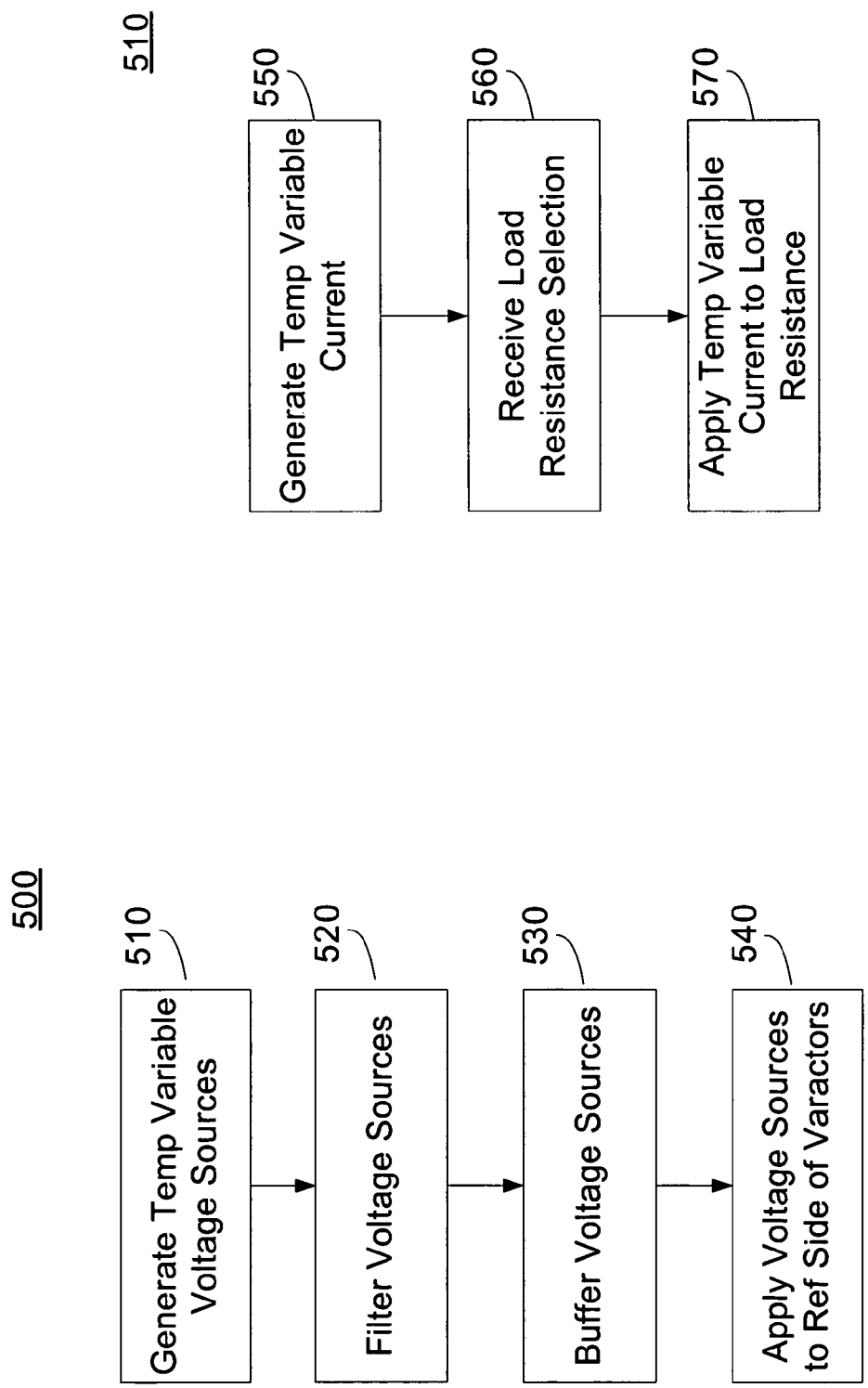
FIGS. 5A–5B are flowcharts of an embodiment of a process of temperature stabilizing a VCO.

FIG. 5A is a flowchart of an embodiment of a method 500 of temperature stabilizing a VCO. The method 500 can be performed within the frequency synthesizer of FIG. 1 or in the VCO of FIG. 2. The method 500 is described as performed within a VCO including the temperature compensation module, such as the VCO of FIG. 2.

The method 500 begins at block 510 where the VCO, using the temperature compensation module, generates a temperature variable voltage source. The temperature variable voltage source can be configured to provide a voltage compensation for the varactors of a resonant circuit. Typically, the temperature variable voltage source is configured with a TC that is substantially complementary to the TC of the varactors or uncompensated VCO over a predetermined operating temperature range.

The VCO proceeds to block 520 and filters the output from the voltage source using, for example, a low pass filter. The low pass filter can be used to reduce any noise contribution attributable to the temperature variable voltage source, which may otherwise contribute to a degradation in phase noise.

After filtering the output from the voltage source, the VCO proceeds to block 530 and buffers the filtered output voltage using, for example, a low noise voltage follower. The voltage follower can be used to present a low impedance to the varactors and to prevent the low pole frequency of the filter from interfering with a loop filter that can be used in a PLL having the VCO.

After buffering the voltage, the VCO applies the buffered voltage to the back or reference side of one or more tuning varactors that are included within the resonant circuit of the VCO. Typically, the VCO resonant circuit includes pairs of varactors configured with common anodes. In such a configuration, the buffered voltage can provide the reference for the varactor pair.

FIG. 5B is a flowchart of an embodiment of a method 510 for generating a temperature variable voltage source as used in the method of FIG. 5A. The method 510 can be performed, for example, using the configuration shown in FIG. 4, or using the temperature compensation module of FIG. 1.

The method 510 begins at block 550 where the temperature compensation module generates a temperature variable current. The temperature variable current can be generated, for example, using a differential amplifier having junction diodes of different areas providing the voltage references for each of the non-inverting and inverting inputs. The differential amplifier can control a current mirror and current source that generates a temperature variable current based on the variations in the junction diodes.

The output of the temperature variable current source can be designed to be loaded with a configurable load resistor. The temperature compensation module proceeds to block 560 and determines a load resistance that compensates for the uncompensated VCO drift. The load resistance providing the TC in combination with the temperature varying current to compensate for the VCO drift can be selected by closing a switch, blowing fuses corresponding to one or more resistors, or some other manner of selection.

After the proper load resistor is selected, the temperature compensation module can proceed to block 570 and apply the temperature variable current to the load resistor having the selected load resistance value. The temperature variable voltage can then be sourced using the voltage across the load resistor.

Figure 6:
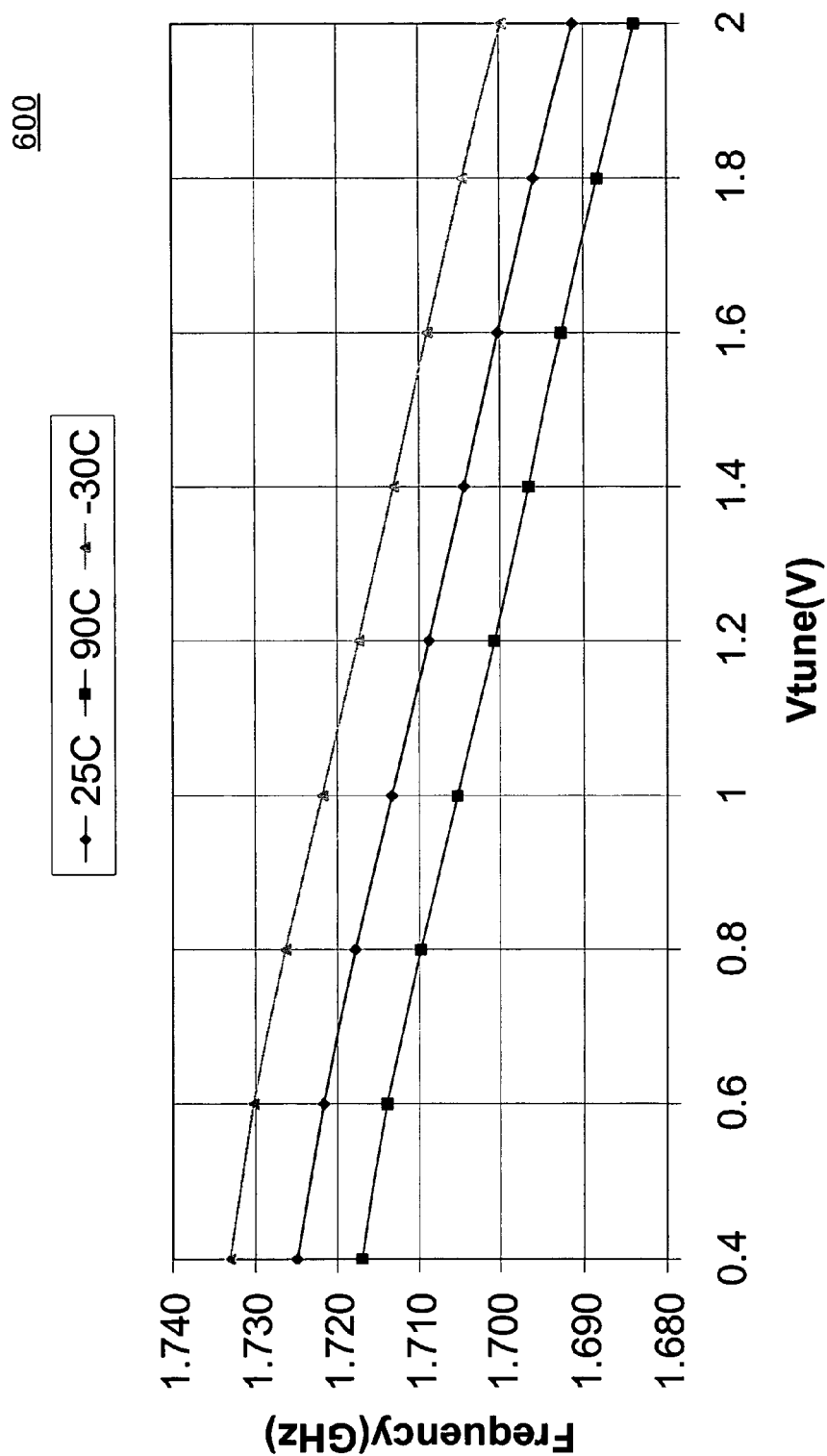
FIG. 6 is a graph of an embodiment of uncompensated VCO frequency response curves over temperature.

FIG. 6 is a graph 600 of an embodiment of uncompensated VCO frequency response curves over temperature. The frequency response curve is plotted over a control voltage of 0.4 volts through 2 volts. Such a control voltage range is typical of an integrated circuit having a 2.2 volt supply voltage and an on-chip VCO configuration where the control voltage is also generated on-chip.

The frequency response curves are plotted for −30, +25, and +90° C., which would exceed a typical environment experienced by a wireless communication device such as a cellular telephone. It can be seen that a substantial portion of the control voltage range is required to maintain the VCO at a particular frequency, for example, 1.710 GHz. As shown in FIG. 6, without any temperature compensation, the frequency drops more than approximately 16 MHz at 1.7 GHz over the temperature range of −30° C. to +90° C.

Figure 7:
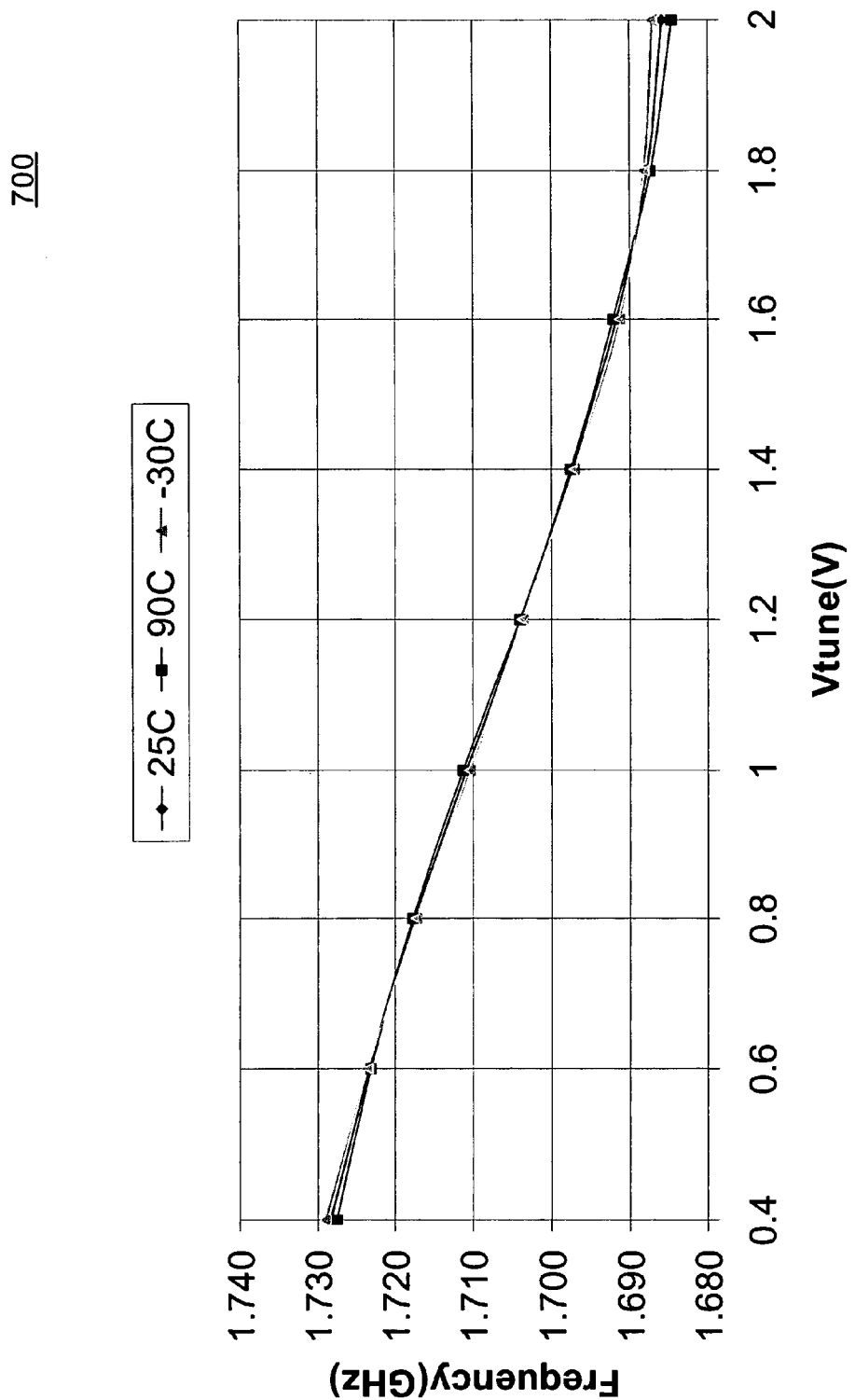
FIG. 7 is a graph of an embodiment of temperature compensated VCO frequency response curves over temperature.

FIG. 7 is a graph 700 of an embodiment of temperature compensated VCO frequency response curves over temperature, where the VCO is temperature compensated according to the methods and apparatus described herein. The frequency response curves are plotted for −30, +25, and +90° C. and demonstrate that the temperature compensation substantially compensates for the VCO frequency drift over temperature.

Figure 8:
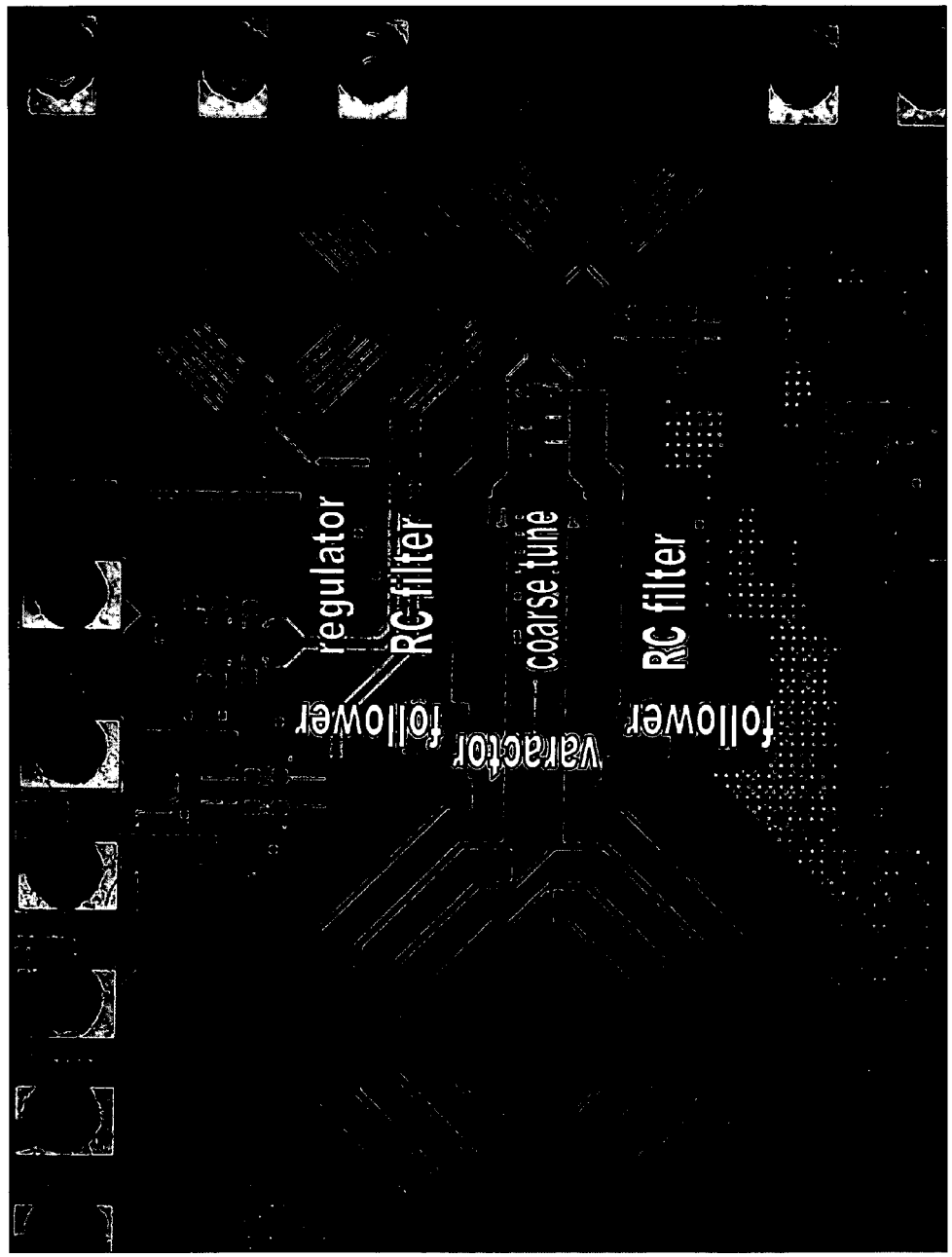
FIG. 8 is a microphotograph of an embodiment of a temperature stabilized VCO.

FIG. 8 is a microphotograph 800 of an embodiment of a temperature stabilized VCO, where the VCO and temperature compensation module are manufactured on a single semiconductor substrate. The VCO can be, for example, the temperature compensated VCO of FIG. 2. The VCO is implemented in a 0.25 μm 4-metal 1-poly CMOS process and packaged in a 32-pin Quad Flat No-Lead (QFN) package, and is configured to operate in the frequency range suitable for a direct conversion CDMA receiver.

The oscillator topology is stacked diff-pairs with regulator similar to that shown in FIG. 2. The regulator reference voltage is generated from a NFET (M6) and the reference voltage noise is attenuated by a first-order filter (R1 & C2). The varactor temperature compensation is configured as shown in FIG. 3. The backside bias voltages generated by the PTAT voltage sources are set at 0.9V and 1.9V at room temperature with their TC adjustable by selection of the appropriate resistor.

The VCO can also be configured to tune across a number of predetermined operating bands through the selective switching of additional fixed capacitors coupled in parallel to the varactors in the LC tank. The inverter supply voltage for coarse tuning transistor can be set to 2V and can have a TC=1000 ppm/° C. This temperature compensation can be used to compensate for the junction voltage drop of the drain bulk junction diodes of the FETs.

With the positive TC biasing voltages provided by the PTAT voltage sources, the frequency drift is lower than 2 MHz over 0.6~1.8V fine tune range, which corresponding to an equivalent TC of less than 10 ppm/° C. Phase noise measurements show that the phase noise decreases at a rate of $1/f^2$ below 4.5 kHz and continues at a rate of $1/f^4$ until approximately 200 kHz where the rate returns back to $1/f^2$ again. Phase noise variation over temperature is less than 1 dB due to the PTAT nature of the VCO biasing current. The VCO can be tuned to cover 1.55 GHz~1.95 GHz through 6 discrete tuning branches with less than 100 kHz/V power supply sensitivity.

Apparatus and methods for compensating temperature sensitive frequency drift in a VCO are disclosed. The apparatus and methods generate a compensating voltage using a temperature varying voltage source, such as a PTAT voltage source. The magnitude and TC of the temperature varying voltage source can be configured to substantially cancel the frequency drift of the VCO when applied to the backside of one or more varactors within a resonant circuit.

To minimize the effects of varying control voltages on the varactors, a plurality of varactors can be configured in parallel, and the compensating voltage bias applied to the varactors configured to span substantially the entire control voltage range.

The various illustrative logical blocks, modules, and circuits described in connection with the embodiments disclosed herein may be implemented or performed with a general purpose processor, a digital signal processor (DSP), a Reduced Instruction Set Computer (RISC) processor, an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

A software module may reside in RAM memory, flash memory, non-volatile memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. An integrated circuit (IC) temperature compensated Voltage Controlled Oscillator (VCO), comprising:
a semiconductor substrate;
an oscillator manufactured on the substrate and having a variable frequency resonant circuit, the frequency of the resonant circuit controlled, in part, based on a control voltage applied to at least one varactor diode;
a first variable voltage source manufactured on the substrate configured to substantially compensate for a temperature sensitive frequency drift attributable to the at least one varactor; and a second variable voltage source manufactured on the substrate configured to substantially compensate for a temperature sensitive frequency drift attributable to the at least one varactor, wherein the variable frequency resonant circuit comprises:

a fixed value inductor manufactured on the substrate and having a first end and a second end;

a first pair of varactor diodes having a common anode connection, and a cathode of a first varactor of the first pair of varactor diodes coupled to the first end of the fixed value inductor and a cathode of a second varactor of the first pair of varactor diodes coupled to the second end of the fixed value inductor, the common anode connection of the first pair coupled to an output of the first variable voltage source;

a second pair of varactor diodes having a common anode connection distinct from the common anode of the first varactor diode pair, and a cathode of a first varactor of the second pair of varactor diodes coupled to a cathode of the first varactor of the first varactor diode pair and a cathode of a second varactor of the second pair of varactor diodes coupled to the cathode of the second varactor of the first varactor diode pair, the common anode connection of the second pair coupled to an output of the second variable voltage source;

a first coupling capacitor configured to couple the cathode of the first varactor to the first end of the fixed value inductor; and a second coupling capacitor configured to couple the cathode of the second varactor to the second end of the fixed value inductor.

2. The VCO of claim 1, wherein the oscillator comprises a CMOS oscillator.

3. An integrated circuit (IC) temperature compensated Voltage Controlled Oscillator (VCO), comprising:

a semiconductor substrate;

an oscillator manufactured on the substrate and having a variable frequency resonant circuit, the frequency of the resonant circuit controlled, in part, based on a control voltage applied to at least one varactor diode;

a first variable voltage source manufactured on the substrate configured to substantially compensate for a temperature sensitive frequency drift attributable to the at least one varactor; and a second variable voltage source manufactured on the substrate configured to substantially compensate for a temperature sensitive frequency drift attributable to the at least one varactor, wherein the variable frequency resonant circuit comprises:

a fixed value inductor manufactured on the substrate and having a first end and a second end;

a first pair of varactor diodes having a common anode connection, and a cathode of a first varactor of the first pair of varactor diodes coupled to the first end of the fixed value inductor and a cathode of a second varactor of the first pair of varactor diodes coupled to the second end of the fixed value inductor, the common anode connection of the first pair coupled to an output of the first variable voltage source;

a second pair of varactor diodes having a common anode connection distinct from the common anode of the first varactor diode pair, and a cathode of a first varactor of the second pair of varactor diodes coupled to a cathode of the first varactor of the first varactor diode pair and a cathode of a second varactor of the second pair of varactor diodes coupled to the cathode of the second varactor of the first varactor diode pair, the common anode connection of the second pair coupled to an output of the second variable voltage source;

a MIM capacitor manufactured on the substrate and coupling the cathode of the first varactor to the first end of the fixed value inductor.

4. The VCO of claim 3, wherein the variable frequency resonant circuit further comprises at least one fixed value capacitor selectively coupled to the resonant circuit and configured to coarse tune a frequency band of operation.

5. An integrated circuit (IC) temperature compensated Voltage Controlled Oscillator (VCO), comprising:

a semiconductor substrate;

an oscillator manufactured on the substrate and having a variable frequency resonant circuit the frequency of the resonant circuit controlled, in part, based on a control voltage applied to at least one veractor diode; and a variable voltage source manufactured on the substrate having an output coupled to a reference end of the at least one varactor and configured to substantially compensate for a temperature sensitive frequency drift attributable to the at least one veractor, wherein the variable frequency resonant circuit comprises:

a fixed value inductor manufactured on the substrate and having a first end and a second end;

a first pair of varactor diodes having a common anode connection, and a cathode of a first varactor of the first pair of varactor diodes coupled to the first end of the fixed value inductor and a cathode of a second varactor of the first pair of varactor diodes coupled to the second end of the fixed value inductor;

a second pair of varactor diodes having a common anode connection distinct from the common anode of the first varactor diode pair, and a cathode of a first varactor of the second pair of varactor diodes coupled to a cathode of the first varactor of the first varactor diode pair and a cathode of a second varactor of the second pair of varactor diodes coupled to the cathode of the second varactor of the first varactor diode pair; and p1 an additional variable voltage source having a temperature sensitive output voltage coupled to the common anode connection of the second varactor diode pair.

6. The VCO of claim 1, wherein the first and second variable voltage sources comprise a PTAT voltage source.

7. The VCO of claim 1, wherein the first and second variable voltage sources comprise:

a PTAT current source; and a resistive load coupled to the output of the PTAT current source and having a selectable temperature coefficient.

8. The VCO of claim 7, wherein the resistive load comprises a plurality of composite resistors coupled in parallel, each of the plurality of composite resistors having a distinct temperature coefficient and configured to selectively load the PTAT current source.

* * * * *